(12) United States Patent
Reichenbach et al.

(10) Patent No.: US 11,227,954 B2
(45) Date of Patent: Jan. 18, 2022

(54) TWO-CHANNEL SEMICONDUCTOR COMPONENT

(71) Applicant: BRANDENBURGISCHE TECHNISCHE UNIVERSITÄT COTTBUS-SENFTENBERG, Cottbus (DE)

(72) Inventors: Martin Reichenbach, Annaburg (DE); Ulrich Wulf, Cottbus (DE); Hans Richter, Frankfurt (DE)

(73) Assignee: BRANDENBURGISCHE TECHNISCHE UNIVERSITÄT COTTBUS-SENFTENBERG

( * ) Notice: Subject to any disclaimer, the term of this patent is extended or adjusted under 35 U.S.C. 154(b) by 0 days.

(21) Appl. No.: 16/958,549

(22) PCT Filed: Dec. 19, 2018

(86) PCT No.: PCT/EP2018/085822
§ 371 (c)(1),
(2) Date: Jun. 26, 2020

(87) PCT Pub. No.: WO2019/129571
PCT Pub. Date: Jul. 4, 2019

(65) Prior Publication Data
US 2021/0043775 A1 Feb. 11, 2021

(30) Foreign Application Priority Data

Dec. 29, 2017 (DE) .......................... 102017131452.0
Feb. 26, 2018 (DE) .......................... 102018104305.8

(51) Int. Cl.
*H01L 29/786* (2006.01)
*H01L 29/08* (2006.01)
(Continued)

(52) U.S. Cl.
CPC ...... *H01L 29/78648* (2013.01); *H01L 27/092* (2013.01); *H01L 29/0653* (2013.01); *H01L 29/0847* (2013.01)

(58) Field of Classification Search
CPC ............. H01L 27/092; H01L 29/78648; H01L 29/0653; H01L 29/0847
(Continued)

(56) References Cited

U.S. PATENT DOCUMENTS

2011/0019488 A1* 1/2011 Bawedin ............. H01L 29/7841
365/189.011
2014/0014905 A1 1/2014 Lee et al.
(Continued)

FOREIGN PATENT DOCUMENTS

EP 2568506 3/2013

OTHER PUBLICATIONS

Kim et al. "Hump Effects of Germanium/Silicon Heterojunction Tunnel Field-Effect Transistors," IEEE Transactions on Electron Devices, Jun. 2016, vol. 63, No. 6, pp. 2583-2588.
(Continued)

*Primary Examiner* — Tong-Ho Kim
(74) *Attorney, Agent, or Firm* — Sheridan Ross P.C.

(57) ABSTRACT

A two-channel semiconductor component has a doped semiconductor body formed from a group IV semiconductor material, a top-side top-gate electrode, and a bottom-side bottom-gate electrode. A source region has a greater extent in a depth direction in the silicon body than a drain region. A source isolation region is arranged between a source region and the top-gate electrode, and a drain isolation region is arranged between a drain region and the top-gate electrode, which isolation region extends in a depth direction as far as to the lower edge of a gate isolation layer of the top-gate electrode. In a first operating state a first
(Continued)

Figure 9:
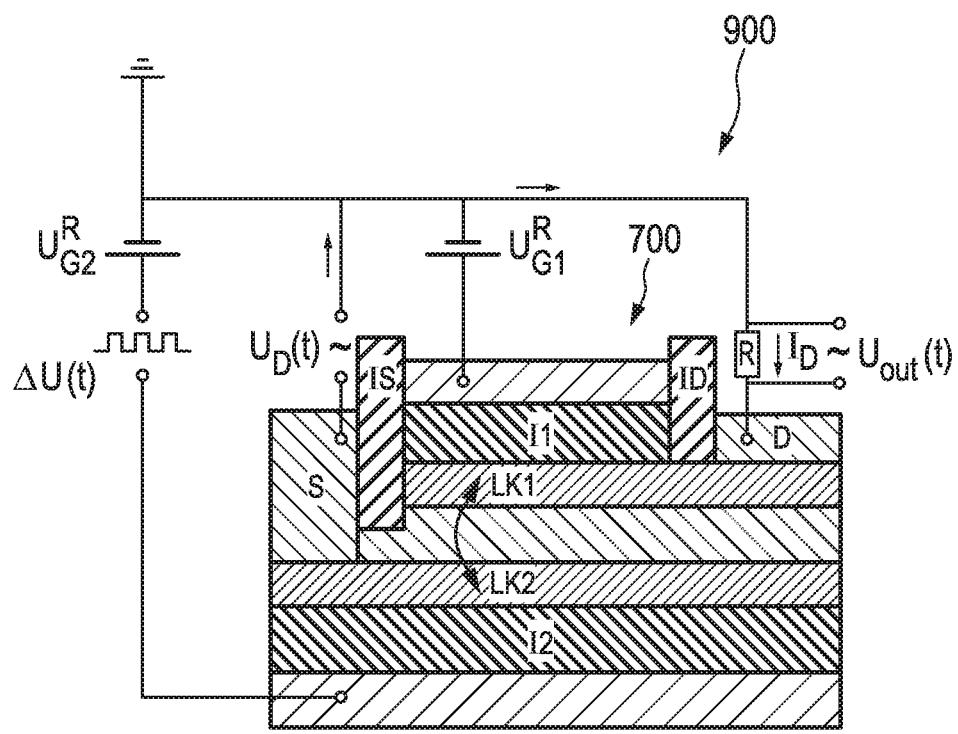

conductive channel separated laterally from the source region by the source isolation region can be formed, as can a second conductive channel, which is decoupled from the first conductive channel by a barrier region of the semiconductor body extending in a depth direction between the conductive channels. In a second operating state which satisfies a resonance condition, the first and second conductive channel can be coupled to one another by means of a tunnel effect for minority charge carriers over the barrier region of the semiconductor body.

6 Claims, 4 Drawing Sheets

(51) Int. Cl.
*H01L 29/06* (2006.01)
*H01L 27/092* (2006.01)

(58) Field of Classification Search
USPC .................................................. 257/365
See application file for complete search history.

(56) References Cited

U.S. PATENT DOCUMENTS

| | | |
|---|---|---|
| 2015/0221499 A1 | 8/2015 | Park et al. |
| 2017/0098716 A1 | 4/2017 | Li et al. |

OTHER PUBLICATIONS

Tsutsui et al. "Proposal and Analysis of Coupled Channel Tunneling FET with New Heterostructures on Silicon," Solid-State Electronics, Jul. 1998, vol. 42, No. 7-8, pp. 1547-1551.
Official Action for German Patent Application No. 102018104305.8, dated Jul. 4, 2018, 5 pages.
Translated International Search Report for International (PCT) Patent Application No. PCT/EP2018/085822, dated Mar. 11, 2019, 3 pages.
Balestra et al. "Double-Gate Silicon-on-Insulator Transistor with Volume Inversion: A New Device with Greatly Enhanced Performance," IEEE Electron Device Letters, Sep. 1987, vol. EDL-8, No. 9, pp. 410-412.
Bernard et al. "Multi-Channel Field-Effect Transistor (MCFET)-Part II: Analysis of Gate Stack and Series Resistance Influence on the MCFET Performance," IEEE Transactions on Electron Devices, Jun. 2009, vol. 56, No. 6, pp. 1252-1261.
Blount et al. "Double electron layer tunnelling transistor (DELTT)," Semiconductor Science and Technology, 1998, vol. 13, pp. A180-A183.
Brown et al. "Resonant tunneling between parallel, two-dimensional electron gases: A new approach to device fabrication using in situ ion beam lithography and molecular beam epitaxy growth," Applied Physics Letters, Apr. 1994, vol. 64, No. 14, pp. 1827-1829.
Cristoloveanu "How Many Gates Do We Need in a Transistor?" IEEE, 2007 International Semiconductor Conference, 2007, pp. 3-10.

Dupre et al. "15nm-diameter 3D Stacked Nanowires with Independent Gates Operation: φFET," 2008 IEEE International Electron Devices Meeting, 4 pages.
Eisenstein et al. "Field-induced resonant tunneling between parallel two-dimensional electron systems," Applied Physics Letters, Apr. 1991, vol. 58, No. 14, pp. 1497-1499.
Eisenstein et al. "Independently contacted two-dimensional electron systems in double quantum wells," Applied Physics Letters, Nov. 1990, vol. 57, No. 22, pp. 2324-2326.
Ernst et al. "Ultimately Thin Double-Gate SOI MOSFETs," IEEE Transactions on Electron Devices, Mar. 2003, vol. 50, No. 3, pp. 830-838.
Fan et al. "A Simulation Study of a Novel Dual-Channel Body-Tied MOSFET," IEEE, Proceedings of the 10th International Workshop Junction Technology, 2010, pp. 243-246.
Hu et al. "Bilayer quantum transistor," Applied Physics Letters, Sep. 2000, vol. 77, No. 10, pp. 1475-1477.
Leuther et al. "Experimental realization of a two-dimensional to two-dimensional tunnel transistor," Semiconductor science and Technology, 1996, vol. 11, pp. 772-775.
Mazumder et al. "Digital Circuit Applications of Resonant Tunneling Devices," Proceedings of the IEEE, Apr. 1998, vol. 86, No. 4, pp. 664-686.
Moon et al. "Unipolar complementary circuits using double electron layer tunneling transistors," Applied Physics Letters, Jan. 1999, vol. 74, No. 2, pp. 314-316.
Moon et al. "Room-temperature InAlAs/InGaAs/InP planar resonant tunneling-coupled transistor," Applied Physics Letters, 2005, vol. 87, 183110, 4 pages.
Nowak et al. "Turning Silicon On Its Edge," IEEE Circuits & Devices Magazine, Jan./Feb. 2004, vol. 20, No. 1, pp. 20-31.
Ohata et al. "Electrical characteristics related to silicon film thickness in advanced FD SOI-MOSFETs," Solid-State Electronics, 2008, vol. 58, pp. 126-133.
Ohno et al. "Gigantic negative transconductance and mobility modulation in a double-quantum-well structure via gate-controlled resonant coupling," Applied Physics Letters, Apr. 1993, vol. 62, No. 16, pp. 1952-1954.
Owen et al. "Electron states in double-channel back-gated HEMT structures," Semiconductor Science and Technology, 1993, vol. 8, pp. 123-126.
Pacha et al. "Resonant Tunneling Device Logic Circuits," Microelectronics Advanced Research Initiative (MEL-ARI), Jul. 1998-Jul. 1999, 22 pages.
Park et al. "Impact of channel width on back biasing effect in tri-gate MOSFET," Microelectronic Engineering, 2014, vol. 114, pp. 91-97.
Park et al. "Back biasing effects in tri-gate junctionless transistors," Solid-State Electronics, 2013, vol. 87, pp. 74-79.
Sakaki "Quantum Microstructure Devices," Solid State Communications, 1994, vol. 92, Nos. 1-2, pp. 119-127.
Simmons et al. "Planar quantum transistor based on 2D-2D tunneling in double quantum well heterostructures," Journal of Applied Physics, Nov. 1998, vol. 84, No. 10, pp. 5626-5634.
Tachi et al. "3D Source/Drain Doping Optimization in Multi-Channel MOSFET," IEEE, 2010 Proceedings of the European Solid State Device Research Conference, 2010, pp. 368-371.
Turner et al. "Tunneling between parallel two-dimensional electron gases," Physical Review B, Oct. 1996, vol. 54, No. 15, p. 10614-10624.

\* cited by examiner

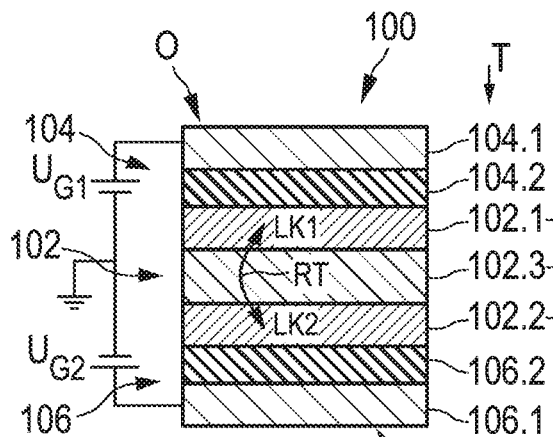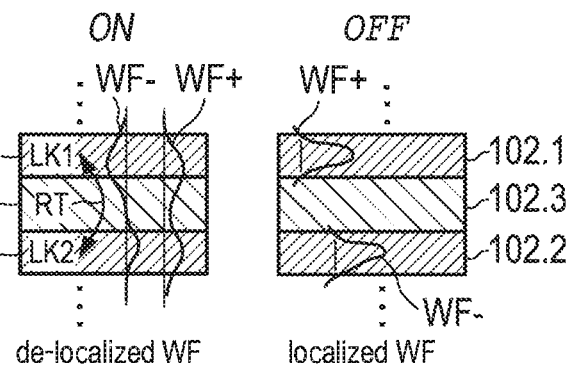
FIG. 1    FIG. 2    FIG. 3
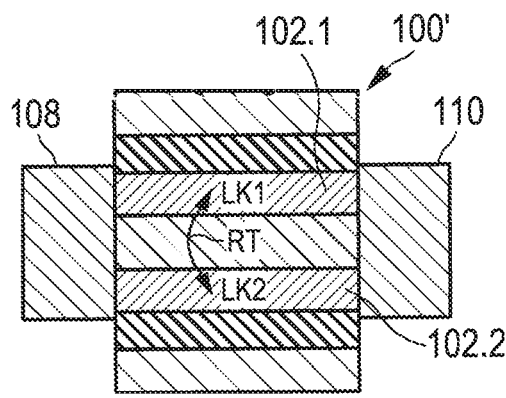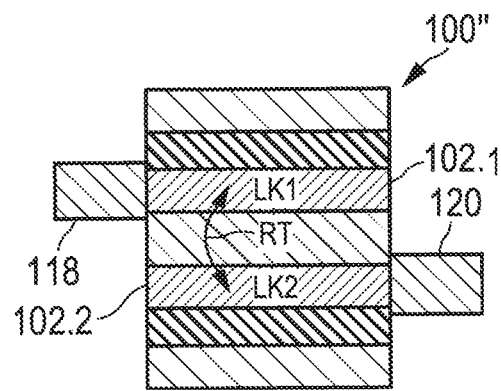
FIG. 4    FIG. 5
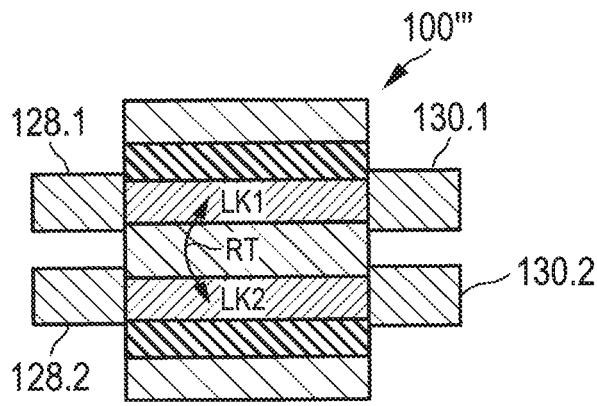
FIG. 6

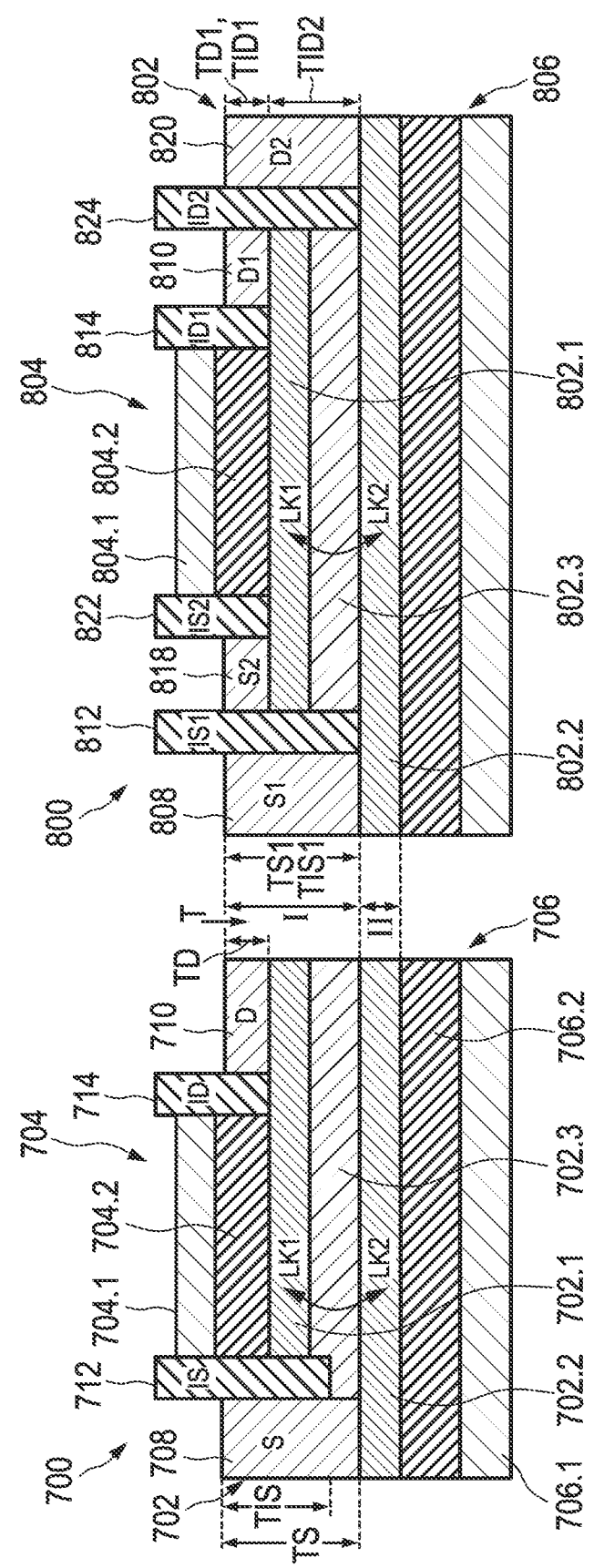

TWO-CHANNEL SEMICONDUCTOR COMPONENT

CROSS REFERENCE TO RELATED APPLICATIONS

This application is a national stage application under 35 U.S.C. 371 and claims the benefit of PCT Application No. PCT/EP2018/085822 having an international filing date of 19 Dec. 2018, which designated the United States, and which PCT application claimed the benefit of German Patent Application No. 102017131452.0 filed 29 Dec. 2017 and German Patent Application No. 102018104305.8 filed 26 Feb. 2018, the contents of each of which are incorporated herein by reference in their entireties.

The present invention relates to a semiconductor component with two spatially separated conductive channels. Such components are also referred to as two-channel semiconductor components.

The generation and gate control of conductive channels in semiconductor components by means of the field effect is well known from field effect transistors and is technologically highly developed in these components in various forms. Components with two spatially separated channels form a special group. They are suitable for use as particularly fast switches and as signal mixers. It shall be noted that, instead of the term "conductive channel", the present application also uses the terms "conduction channel" or simply "channel" with the same meaning.

In known two-channel components with gate control, coupling between the conductive channels can be achieved by means of a resonant tunnel effect. Such known two-channel components differ in the dimensionality of the conduction channels, i.e. in the spatial limitation of the charge carrier mobility in the conduction channels to one level or one line, in the contacting of the conduction channels and in the respectively used material system.

As material system, prior art uses III-V semiconductor heterostructures, e.g. GaAs/AlGaAs, on the one hand, and CMOS-compatible and therefore—from a technological and economic point of view—particularly interesting semiconductor/oxide structures, such as Si/SiO2 structures.

Since GaAs/AlGaAs heterostructures can be produced epitaxially, the wave functions of their charge carriers have long coherence lengths, and one- and two-dimensional charge carrier gases can be used as channels.

Furthermore, in known III-V semiconductor heterostructures, the option of selective (separated, i.e. non-parallel) contacting of the source/drain electrode by means of so-called depletion gates, which are provided in addition to the respective control gate, was realized. A respective depletion gate is provided for each channel. Through the application of a suitable voltage to a corresponding depletion gate, the assigned channel is depleted locally—below or above the depletion gate—of free charge carriers and thus interrupted and separated from the adjacent source or drain contact. As long as the separation exists, the separated contact is only connected to the respective other channel.

The depletion gate method used in III-V semiconductors requires a barrier between the conduction channels, for example in the form of an AlGaAs separation layer between GaAs channels. Without such a barrier, a depletion voltage at a depletion gate would only lead to an undesired merging of the two conduction channels.

The lateral component dimensions achieved with a depletion gate in the III-V material system are in the micrometer range, which, compared to the current state of silicon-based CMOS technology, is disproportionately large.

Significant progress with regard to the miniaturization of the components, with a channel length of down to approx. 10 nm, were achieved in the field effect or bipolar transistors customary in mass production through the material system of the group IV semiconductors, which forms the backbone of the CMSO technology. However, a barrier between the conduction channels, as used in multi-channel components using III-V semiconductors, is not correspondingly available in silicon-based CMOS technology. In addition, it would be desirable to be able to also realize a four-pole geometry in a two-channel semiconductor component.

US 2017/0098716 A1 shows a field effect transistor consisting of two-dimensional monolayers separated by an interlayer, which makes it possible to tunnel charge carriers.

US 2014/0014905 A1 describes a field effect transistor that includes a graphene channel layer on a substrate.

The present invention now proposes an improved two-channel semi-conductor component having
  a doped semiconductor body formed from a group IV semiconductor material;
  a top-side top-gate electrode;
  a bottom-side bottom-gate electrode,
  a first source electrode with a doped first source region of a second conductivity type—that is opposite to the first conductivity type—formed in the semiconductor body,
  a first drain electrode with a doped first drain region of the second conductivity type formed in the semiconductor body; wherein
  the first source region has a greater extent in a depth direction in the silicon body than the first drain region, and divides the semiconductor body into a first depth section, that extends as far as to a lower edge of the first drain region, and a second depth region, that extends in a depth direction adjacently to the first depth section as far as to the bottom side of the semiconductor body;
  from a lateral point of view, a first source isolation region is arranged between a first source region and the top-gate electrode, wherein said first source isolation region electrically isolates the source electrode and the top-gate electrode from each other and extends in a depth direction into the first depth section of the semiconductor body, but not into the second depth section;
  from a lateral point of view, a first drain isolation region is arranged between the first drain region and the top-gate electrode, wherein said first drain isolation region electrically isolates the drain electrode and the top-gate electrode from each other and extends in a depth direction as far as to the lower edge of the gate isolation layer; wherein
  the respective dimensions of the first source region, of the first drain region, of the first source isolation region and of the first drain isolation region in a depth direction are chosen such that
    in a first operating state, in which respective first and second operating voltages are applied to the top-gate electrode and the bottom-gate electrode, a first conductive channel of the second conductivity type, which is separated laterally from the first source region by the source isolation region, can be formed in the first depth section, and a second conductive channel of the second conductivity type, which is decoupled from the first conductive channel by a barrier region of the semiconductor body extending in a depth direction between the conductive channels, can be formed in the second depth section, and
in a second operating state, in which third and fourth operating voltages satisfying a resonance condition are applied to the top-gate electrode and the bottom-gate electrode, the first and second conductive channel can be coupled to one another by means of a tunnel effect for minority charge carriers over the barrier region of the semiconductor body.

The design of a two-channel semiconductor component according to the invention provides for a special form of selective contacting of the channels, which, while it is not known from traditional CMOS-compatible field effect transistors, is compatible with the CMOS technology even with the high scaling customary in industrial production today. These are significant improvements compared to the aforementioned, previously realized selectively contacted two-channel systems in the GaAs/AlGaAs material system with channel lengths of more than 1 μm.

In the two-channel semiconductor component according to the invention, the first source region has a greater extent in a depth direction in the semiconductor body than the first drain region. Thus, the semiconductor body can be divided into two depth sections, namely into a first depth section extending as far as to a lower edge of the first drain region, and
into a second depth section extending in a depth direction adjacently to the first depth section as far as to the bottom side of the semiconductor body;

From a lateral point of view, a first source isolation region is arranged between a first source region and the top-gate electrode, wherein said first source isolation region electrically isolates the source electrode and the top-gate electrode from each other. It extends in a depth direction into the first depth section of the semiconductor body, but not into the second depth section. From a lateral point of view, a first drain isolation region is at the same time arranged between the first drain region and the top-gate electrode, wherein said first drain isolation region electrically isolates the drain electrode and the top-gate electrode from each other and extends in a depth direction as far as to the lower edge of the gate isolation layer. This allows for the formation of a channel that is in direct contact exclusively with the drain electrode—i.e. is separated laterally from the first source region by the first source isolation region—in the first depth section.

At the same time, a suitable choice of the respective dimensions of the first source region, of the first drain region, of the first source isolation region and of the first drain isolation region in a depth direction, allows for the formation of a second conductive channel of the second conductivity type—which is decoupled from the first conductive channel by a barrier region of the semiconductor body extending in a depth direction between the conductive channels—in the second depth section. What is essential in this regard is the already mentioned feature of the two-channel semiconductor component according to the invention that the first source region has a greater extent in a depth direction in the semiconductor body than the first drain region. The second conductive channel, that is controllable via the bottom-gate electrode on the bottom side, is therefore formed such that it is in direct contact only with the source electrode.

Thus, this design ensures that the charge carrier transport from the source electrode to the drain electrode can only take place through the resonant tunneling of charge carriers through the formed barrier region in accordance with the laws of the quantum mechanical tunnel effect. This quantum mechanical tunnel coupling between the conductive channels in the two-channel semiconductor component according to the invention shows a resonance behavior also at a shorter channel length, even in the range of a channel length of approximately 10 nm. As a result, the channels can be completely coupled or decoupled with very small changes in the top-gate voltage and bottom-gate voltage, if the resonance is sharp. In case of the present coupling, very few charges flow in the short channels over short distances, which promotes a high switching speed with a small power loss.

Thus, the two-channel semiconductor component according to the invention realizes a lateral current transport between source and drain electrodes by means of transversal resonant tunneling of charge carriers between the conductive channels.

It needs to be mentioned that, as a general rule, the functions of the source and drain regions in the two-channel component according to the invention are interchangeable, so that therefore the functional association of electrodes, semiconductor regions and isolation regions with the source or drain chosen above is also interchangeable. However, for the sake of the clarity of the description, the above association will be applied in the form chosen above also to the further description; however, this does not imply any limitation of the present invention.

In the following, exemplary embodiments of the two-channel semiconductor component according to the invention are described.

In one embodiment, the two-channel semiconductor component is configured as a two-terminal component.

In preferred embodiments, the conduction channels have a channel length of less than 30 nm. As known from traditional field effect transistors, the channel length refers to the lateral distance in the semiconductor body that charge carriers bridge between the source and the drain region at the conductivity controlled by the respective gate electrode. Special embodiments that can be achieved by means of particularly highly scaled CMOS technology have a channel length of less than 20 nm, for example 10 nm, or even only between 5 and 10 nm. With—per se—known modern technologies, a channel length of only 5 nm can be achieved.

An example of a suitable dopant concentration in the conductive channels is $10^{15}$ cm$^{-3}$. However, higher or lower values, preferably in the range between $10^{14}$ cm$^{-3}$ and $10^{16}$ cm$^{-3}$, can also be used.

In preferred embodiments, the extent of the barrier region in a depth direction, i.e. the distance between the conductive channels that must be bridged through resonant tunneling in the second operating state, is between 10 and 30 nm, preferably approximately 20 nm. This distance can be set in a targeted manner during the design process of the two-channel component through the specification of the dopant concentration in the barrier region. The higher the dopant concentration in the barrier region, the smaller a distance of the barrier region can be chosen. An increased dopant concentration changes the energetic level of the barrier to be tunneled.

As a general rule, both gate electrodes must be operated in a homopolar manner during the operation of the two-channel component. At a set bias voltage of the bottom-gate electrode, the satisfaction of the resonance condition for the second operating state becomes apparent in the two-channel component when the voltage at the top-gate electrode is "run through" a peak of the drain current. The bias voltage at the bottom-gate electrode can be used to adjust the energetic level of the tunnel barrier over a certain range. An energetically higher tunnel barrier provides a sharper resonance, which is shown by a peak of the drain current in a smaller interval of the voltage at the top-gate electrode. In case of an energetically higher tunnel barrier, the peak of the drain current has a smaller maximum amplitude than in case of a lower tunnel barrier. In one embodiment, where the two-channel semiconductor component is realized as a four-terminal component, it further comprises

- a second source region which is laterally arranged between the first source region and the top-gate electrode, has a smaller extent in a depth direction than the first source region and is laterally electrically isolated from the first source region by the first source isolation region, and which is laterally electrically isolated from the top-gate electrode by a second source isolation region, and
- a second drain region, which, from a lateral point of view, is arranged at a greater distance from the top-gate electrode than the first drain region, has a greater extent in a depth direction than the first drain region and is laterally electrically isolated from the first drain region by a second drain isolation region and which extends into the second depth section.

In this embodiment, the respective dimensions of the first and second source region, of the first and second drain region, of the first and second source isolation region and of the first and second drain isolation region in a depth direction are preferably chosen such that the first conductive channel extends in the lateral direction between the second source region and the first drain region, and that the second conductive channel extends in the lateral direction between the first source region and the second drain region.

In one exemplary embodiment, the two-channel semiconductor component is used as part of a signal mixer which has a two-channel semiconductor component according to the invention or one of its embodiments, which is supplied a first input signal via the bottom-gate electrode, which is supplied a second input signal via the source electrode, and at the drain electrode of which an output signal can be picked up via an output resistance.

In another embodiment, the two-channel semiconductor component is used as a tunable detector for electromagnetic waves. In this embodiment, a tunable sensitivity of the drain current to electromagnetic waves in accordance with a correspondingly determined energy can be achieved through the tuning of the bottom- and top-gate voltage. In this embodiment, the resonance condition is satisfied by the sum of a preset static energetic component in the form of the two gate voltages and a dynamic energetic component in the form of the energy of the electromagnetic waves with the wavelength to be detected radiated into the semiconductor body. The more intensely the light of this wavelength radiates, the higher the detected drain current will be.

Figure 10:
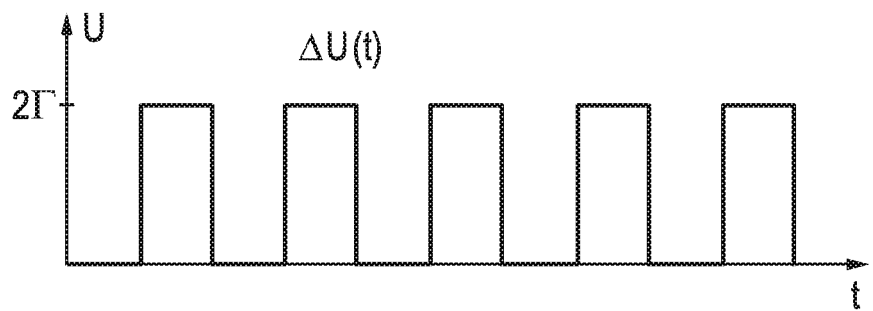
Figure 11:
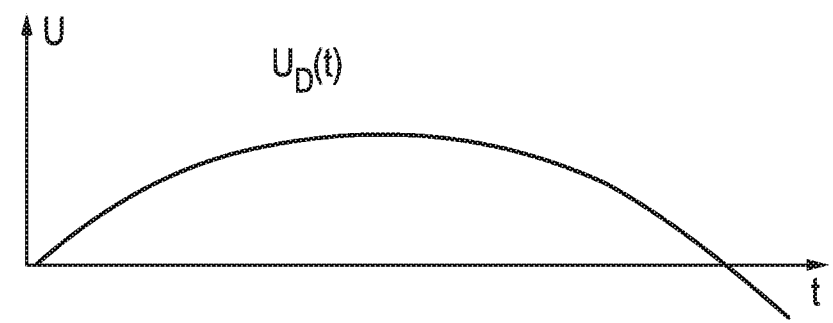
Figure 12:
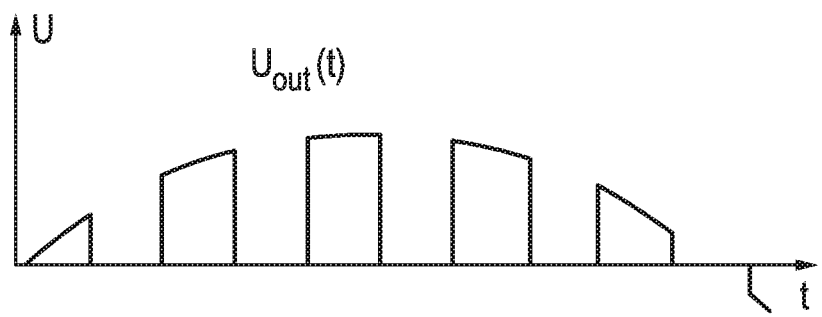

In the following, further exemplary embodiments will be described with reference to the accompanying figures. The following is shown in FIG. 1 a schematic illustration of a two-channel semiconductor component with two gated tunnel-coupled conduction channels;

FIGS. 2 and 3 illustrations showing charge carrier wave functions in the area of the conduction channels of the two-channel semiconductor component of FIG. 1 in case of a resonant coupling of the conduction channels (FIG. 2) and in case of decoupled conduction channels (FIG. 3);

FIG. 4 a schematic illustration of the two-channel semiconductor component of FIG. 1 with parallel contacting of the source and drain electrodes for parallel controlling of both conduction channels;

FIG. 5 a schematic illustration of a two-channel semiconductor component with selective contacting of respectively one source or drain electrode for separate controlling of the conduction channels;

FIG. 6 a schematic illustration of a two-channel semiconductor component configured as a four-terminal component with selective contacting of respectively both source or drain electrodes for separate controlling of the conduction channels;

FIG. 7 a schematic cross-sectional view of a two-channel semiconductor component with selective contacting of respectively one source or drain electrode for separate controlling of the conduction channels;

FIG. 8 a schematic cross-sectional view of a two-channel semiconductor component configured as a four-terminal component with selective contacting of respectively both source or drain electrodes for separate controlling of the conduction channels;

FIG. 9 a schematic cross-sectional view of the two-channel semiconductor component of FIG. 7 with circuitry for forming a signal mixer;

FIG. 10 an exemplary signal of a local oscillator voltage $\Delta U(t)$ as a function of the time that can be supplied to the signal mixer of FIG. 9;

FIG. 11 an exemplary signal of a high-frequency signal $U_D(t)$ as a function of the time that can be supplied to the signal mixer of FIG. 9;

FIG. 12 an output signal of the signal mixer of FIG. 9.

FIG. 1 shows a schematic illustration of a two-channel semiconductor component with two gated tunnel-coupled conduction channels. A semiconductor body in the form of a silicon body 102 forms a substrate, on the top side of which a top-gate electrode 104 is formed and on the bottom side of which a bottom-gate electrode 106 is formed. Instead of silicon, germanium or silicon-germanium may also be used as semiconductor body.

In the following, more details regarding the substrate formed by the silicon body 102, the top-gate electrode 104 and the bottom-gate electrode 106 will be explained.

In the state shown in FIG. 1, two n-conductive channels 102.1 and 102.2 are formed in the silicon body 102, which, as such, consists of p-doped silicon, wherein the n-conductive channels 102.1 and 102.2 extend between the source and drain electrodes—which are not shown in FIG. 1—and are, in the following, also in short referred to as conduction channel 1, 2 or LK1, LK2. Further details on the different options for forming the source and drain electrodes as well as on the circumstances, under which the conduction channels 1 and 2 are formed are provided further below.

A depth direction T points from the top side O of the silicon body 102 to the bottom side U, i.e. in the stacking direction of the illustrated layered arrangement. In this depth direction, the silicon body 102 forms a barrier 102.2 between the conduction channels 102.1 and 102.2.

The top-gate electrode 104 is formed of an electrically conductive layer 104.1 on a top-gate isolation layer 104.2 made of dielectric material. The gate isolation layer 104.2 rests on the top side of the silicon body 102.

The bottom-gate electrode 106 is formed of an electrically conductive layer 106.1 on a bottom-gate isolation layer 106.2 made of dielectric material. The bottom-gate isolation layer 106.2 rests on the bottom side of the silicon body 102.

FIGS. 2 and 3 show illustrations showing charge carrier wave functions in the area of the conduction channels of the two-channel semiconductor component of FIG. 1 in case of a resonant coupling of the conduction channels (FIG. 2) and in case of decoupled conduction channels (FIG. 3). In addition to the conductive channels 102.1 and 102.2 and the barrier region 102.3, FIG. 2 shows in the silicon body in schematic form quantum mechanical wave functions WF+ and WF− of charge carriers. The location-dependent illustration shows the amplitudes of the wave functions at the respective location within the shown area of the silicon body 102.

As generally known, a probability with which a particle is at a certain location can be derived from the amplitude of the quantum mechanical wave functions. In case of FIG. 2, both wave functions WF+ and WF− respectively show two extreme values, namely within the two conduction channels 102.1 and 102.2, and reduced amplitudes in the area of the barrier 102.3. This corresponds to the desired coupling state between the conduction channels 102.1 and 102.2, which is expressed by the illustrated de-localized wave functions WF+ and WF+. In this case, the probability with which the individual charge carriers are at a certain location is simultaneously distributed over both channels. This corresponds to a situation in which a resonant tunnel effect is created by appropriately selected control voltages UG1 and UG2 applied to the top and bottom gate. This means that, in the illustrated resonance case, the conduction channels 102.1 and 102.2 are coupled, since the charge barriers between them are able to tunnel through the barrier 102.3, so that a charge carrier tunnel current is able to flow between the conduction channels.

FIG. 3, as well, shows, in addition to the conductive channels 102.1 and 102.2 and the barrier region 102.3 in the silicon body, in a schematic form quantum mechanical wave functions WF+ and WF− of electrons, however for the case in which the conduction channels 102.1 and 102.2 are decoupled from each other, which, in turn, can be achieved through appropriately selected control voltages UG1 and UG2.

The location-dependent illustration of the wave functions shows that the amplitudes of the wave functions of electrons are localized within the conduction channels 102.1 and 102.2 and do not extend into the respective other conduction channel. This corresponds to a decoupled state between the conduction channels 102.1 and 102.2, which is expressed by the illustrated strongly localized wave functions WF+ and WF−. In this case, the probability with which the individual charge carriers are at a certain location is also strongly limited to one of the two conduction channels. This corresponds to a situation in which a resonant tunnel effect is prevented by appropriately selected control voltages UG1 and UG2 applied to the top and bottom gate.

Thus, switching between the two states of FIGS. 2 and 3—coupled and decoupled—can be achieved by appropriately selected control voltages UG1 and UG2 at the top- and bottom-gate electrode.

In the following, different versions of contacting are shown for the two-channel component illustrated in FIG. 1 by means of FIGS. 4 to 6.

FIG. 4 shows a schematic illustration of a first version 100' of the two-channel semiconductor component of FIG. 1 with parallel contacting of the source and drain electrodes for parallel controlling of both conduction channels. In case of this form of contacting, a source electrode 108 and a drain electrode 110 are each in direct contact with both conduction channels 102.1 and 102.2. In this version, a charge carrier current can also flow when the control voltages UG1 and UG2 applied do not create a resonant tunnel effect, i.e. when the conduction channels are decoupled.

FIG. 5 shows a schematic illustration of a second version 100" of the two-channel semiconductor component of FIG. 1 with selective contacting, i.e. where, in the decoupled state, a source electrode 118 is only connected to the first conduction channel 102.1, and a drain electrode 120 is, in the decoupled state, only connected to the second conduction channel 102.2. Thus, in this case, a charge carrier current can flow between the source electrode 108 and the drain electrode only if suitable control voltages UG1 and UG2 are applied for setting a resonant tunnel effect.

FIG. 6 shows a schematic illustration of a third version 100''' of the two-channel semiconductor component of FIG. 1, which is configured as a four-terminal component. In each case, two source electrodes 128.1 and 128.2 that can be controlled electrically separately from each other, and two drain electrodes 130.1 and 130.2 that can be controlled electrically separately from each other allow for separate controlling of the conduction channels 102.1 and 102.2 in different case constellations. These constellations are explained in more detail below.

FIG. 7 shows a schematic cross-sectional view of a two-channel semiconductor component 700 that provides for selective contacting of respectively one source or drain electrode for separate controlling of two conduction channels, in accordance with the version shown in FIG. 5. In this document, this type of contacting is also referred to as "diagonal contacting". The structure of the two-channel semiconductor component 700 is explained below.

The two-channel semiconductor component 700 has a p-doped silicon body 702, wherein a top-gate electrode 704 is arranged on the top side of the silicon body 702 and a bottom-gate electrode 706 is arranged on the bottom side of the silicon body 702. The top-gate electrode 704 is composed of an electrically conductive layer 704.1 on a top-gate isolation layer 704.2 made of dielectric material. The gate isolation layer 704.2 rests on the top side of the silicon body 702, which is structured for this purpose. The silicon body 702 is laterally structured, as will be explained in more detail further below. The bottom-gate electrode 706 is formed of an electrically conductive layer 706.1 on a bottom-gate isolation layer 706.2 made of dielectric material. The bottom gate isolation layer 706.2 rests on the bottom side of the silicon body 102 and extends laterally across the entire bottom side of the silicon body 702. Likewise, the electrically conductive layer 706.1 that rests on the bottom gate isolation layer 706.2 extends laterally across the entire bottom side of the silicon body 702.

A source electrode has a doped source region 708 of the n-conductivity type, which is formed in the silicon body 702. Additional structural elements of the source electrode, in particular for contacting the source region, are—for the sake of the simplicity of the illustration—not shown in FIG. 7. They can be produced by means of known methods of CMOS technology.

A drain electrode has a doped drain region 710 of the n-conductivity type, which is formed in the silicon body 702.

As can be clearly seen in FIG. 7, the source region 708 has an extent TS in a depth direction T in the silicon body 702 which is greater than the one of the drain region 710, which, accordingly, has a smaller extent TD in a depth direction. The extent TD in a depth direction corresponds approximately to the doping depth of a source/drain region that is customary for the CMOS technology used. The comparatively greater extent TS in a depth direction of the source region 708 divides the silicon body 702 for the purposes of the following explanation into a first depth section I, that extends from the surface of the silicon body 702 to a lower edge of the source region 708, i.e. that corresponds to the extent TS in a depth direction of the source region, and into a second depth section II, that extends in the depth direction T adjacently to the first depth section I as far as to the bottom side of the silicon body 702. As explained above, the bottom gate isolation layer 706.2 rests on the bottom side of the silicon body 702 and can therefore not be considered to be part of the silicon body 702.

In the following, the structure of the top-gate electrode 704 in its environment is explained in more detail. From a lateral point of view, a source isolation region 712 is arranged between the source region 708 and the top-gate electrode 704, wherein the source isolation region 712 electrically isolates the source region 708 and the top-gate electrode 704 from each other. An extent TIS in a depth direction of the source isolation region 712 extends into the first depth section I of the silicon body and beyond the extent TS in a depth direction of the drain region 710, but does not extend into the second depth section II. Thus, the source isolation region has an extent TIS in a depth direction that is greater than the one of the drain region 710, but smaller than the one of the source region 708.

From a lateral point of view, a drain isolation region 714 is arranged between the first drain region 710 and the top-gate electrode 704, wherein the drain isolation region 714 electrically isolates the drain region 710 (and the entire drain electrode along with it) and the top-gate electrode 704 from each other. The extent TID in a depth direction T of the drain isolation region 714 extends as far as to the lower edge of the gate isolation layer, and also as far as to the lower edge of the drain region 710. Thus, the gate isolation region is arranged in a recess formed in the silicon body 702.

The dimensions of the source region 708, the drain region 710, the source isolation region 712 and the drain isolation region 714 in a depth direction are chosen such that, during the operation of the two-channel semiconductor component, a first conduction channel 702.1 is formed below the top-gate electrode 704 and a second conduction channel 702.2, that is separated from the first conduction channel 702.1, is formed above the bottom-gate electrode 706 in the silicon body 702, when suitable control voltages UG1 and UG2 (cf. FIG. 1) are available at the top-gate electrode 704 and the bottom gate electrode 706. The two conduction channels 702.1 and 702.2 are separated from each other by a barrier region 702.3 of the silicon body 702, which is formed when suitable gate voltages are chosen.

This means that, when respective suitable first and second operating voltages UG1 and UG2 are applied to the top-gate electrode 704 and the bottom-gate electrode 706, the first conductive channel 702.1 of the n-conductivity type, which is laterally separated from the source region 708 by the source isolation region 712, is formed in the first depth section I. The extent in a depth direction of said first conductive channel 702.1 can be influenced via the control voltage UG1 applied to the top-gate electrode 704. This conductive channel 702.1 does not have any direct contact with the source region 708, since, in a depth direction T, it does not extend as far as the lower edge of the source isolation region 712, but ends slightly higher up in the silicon body 702. Therefore, the n-doped source region 708 laterally adjoins the barrier region 702.3 of the p-doped silicon body below the source isolation region 712. During operation, charge carriers are not able to pass the thus created barrier zone at the interface between the silicon body 702 and the source region 708.

Furthermore, in this state, where said first and second operating voltages UG1 and UG2 are applied to the top-gate electrode 704 and the bottom-gate electrode 706, a second conductive channel 702.3 of the n-conductivity type is formed in the second depth section II of the silicon body 702. The extent in a depth direction of said second conductive channel 702.2 can be influenced via the control voltage UG2 applied to the bottom-gate electrode 706. To put it more specifically: the voltage applied to the bottom-gate electrode 706 influences how far the second conductive channel 702.2 extends "upwards"—in the direction of the top side of the silicon body—from the bottom side of the silicon body 702. The second operating voltage UG2 is chosen such that the second conductive channel is only formed below the source region 708, but preferably extends as far as directly to the lower edge of the source region 708.

Depending on the chosen operating voltages UG1 and UG2, the following operating states, in particular, can be set:

a) in a first operating state, in which respective first and second operating voltages are applied to the top-gate electrode 704 and the bottom-gate electrode 706, a first conductive channel 702.1, which is separated laterally from the source region 708 by the source isolation region 712, is formed in the first depth section, and a second conductive channel 702.2, which is decoupled from the first conductive channel by a barrier region 702.3 of the silicon body 702 extending in a depth direction between the conductive channels, is formed in the second depth section. This operating state corresponds to the state shown in FIG. 3. In this operating state, no charge carriers can flow between the source region 708 and the drain region 710.

b) in a second operating state, in which third and fourth operating voltages satisfying a resonance condition are applied to the top-gate electrode 704 and the bottom-gate electrode 706, the first and second conductive channel 702.1 and 702.2 can be coupled to one another by means of a tunnel effect for electrons over the barrier region 702.3 of the silicon body. This means that only in the second operating state can charge carries flow between the source region 708 and the drain region 710, namely through the second conductive channel 702.2, by means of the tunnel effect through the barrier region 702.3, and through the first conductive channel 702.1.

Thus, the two-channel semiconductor component 700 forms a controllable switch. Said switch is characterized in that, if a sharp resonance is present, switching can be achieved with very small changes in the voltage of the control voltages. This means that, on the one hand, small switching current with small power losses, i.e. with little heating, are achieved, and, on the other, particularly short switching times.

The structure of the semiconductor component is suitable for integration into existing CMOS technologies and can be scaled accordingly. Preferably, a SOI wafer can be used for the manufacture of the semiconductor component. The choice of material for the individual layers, in particular of the gate electrodes of the isolation layers etc., may be made in accordance with a respectively used CMOS technology. Therefore it is, in particular, dictated by the scaling achieved by the respective CMOS technology, i.e. by the technology-dependent minimum structure width.

FIG. 8 shows a schematic cross-sectional view of a two-channel semiconductor component 800 configured as a four-terminal component with selective contacting of respectively both source or drain electrodes for separate controlling of the conduction channels.

The two-channel semiconductor component 800 has a p-doped silicon body 802, wherein a top-gate electrode 804 is arranged on the top side of the silicon body 802 and a bottom-gate electrode 806 is arranged on the bottom side of the silicon body 802. The top-gate electrode 804 is composed of an electrically conductive layer 804.1 on a top-gate isolation layer 804.2 made of dielectric material. The gate isolation layer 804.2 rests on the top side of the silicon body 802, which is structured for this purpose. The silicon body 802 is laterally structured, as will be explained in more detail further below. The bottom-gate electrode 806 is formed of an electrically conductive layer 806.1 on a bottom-gate isolation layer 806.2 made of dielectric material. The bottom gate isolation layer 806.2 rests on the bottom side of the silicon body 802 and extends laterally across the entire bottom side of the silicon body 802. Likewise, the electrically conductive layer 786.1 that rests on the bottom gate isolation layer 806.2 extends laterally across the entire bottom side of the silicon body 802.

A first source electrode has a doped first source region 808 of the n-conductivity type, which is formed in the silicon body 802. Additional structural elements of the source electrode, in particular for contacting the source region, are—for the sake of the simplicity of the illustration—not shown in FIG. 8. They can be produced by means of known methods of CMOS technology.

A first drain electrode has a doped drain region 810 of the n-conductivity type, which is formed in the silicon body 802.

In addition to these structural elements that are also comprised by the two-channel component 700 of FIG. 7. the exemplary embodiment of FIG. 8 has a second source region 818. Said second source region 818 is arranged laterally between the first source region 808 and the top-gate electrode 804. The second source region 818 has a smaller extent in a depth direction than the first source region 808. In this case, the extent in a depth direction corresponds to the one of the first drain region 810.

There is also a second drain region 820. Said second drain region 820 is, from a lateral point of view, arranged at a greater distance from the top-gate electrode 804 than the first drain region 810. The second drain region 820 has a greater extent in a depth direction than the first drain region 810. The extent in a depth direction of the second drain region 820 corresponds to the one of the first source region 808.

The second source region 818 is laterally electrically isolated from the first source region 808 by the first source isolation region 812. In this case, the extent in a depth direction of said first source isolation region 812 extends—in contrast to what is the case in the exemplary embodiment of FIG. 7—as far as to the lower edge of the first source region 808. The second source region 818 is laterally electrically isolated from the top-gate electrode 804 by a second source isolation region 822.

The second drain region 820 is laterally electrically isolated from the first drain region by a second drain isolation region 824. The second drain isolation region extends into the second depth section II and has the same extent in a depth direction as the first source isolation region 812.

As can be clearly seen in FIG. 8, the first source region 808 has an extent TS1 in a depth direction T in the silicon body 802 which is greater than the one of the drain region 810, which, accordingly, has a smaller extent TD1 in a depth direction. The extent TD1 in a depth direction corresponds approximately to the doping depth of a source/drain region that is customary for the CMOS technology used.

In the following, the structure of the top-gate electrode 804 in its environment is explained in more detail.

From a lateral point of view, the already mentioned second source isolation region 822 is arranged between the second source region 818 and the top-gate electrode 804, wherein the second source isolation region 822 electrically isolates the second source region 818 and the top-gate electrode 804 from each other. An extent TIS2 in a depth direction of the second source isolation region 822 into the first depth section I of the silicon body corresponds to the extent in a depth direction of the first drain isolation region 814 and extends as far as to the lower edge of the gate isolation layer 804.2.

From a lateral point of view, a first drain isolation region 814 is arranged between the first drain region 810 and the top-gate electrode 804, wherein the drain isolation region 814 electrically isolates the drain region 810 (and the entire drain electrode along with it) and the top-gate electrode 804 from each other. The extent TID1 in a depth direction T of the first drain isolation region 814 extends as far as to the lower edge of the gate isolation layer 804.2, and also as far as to the lower edge of the first drain region 810. Thus, the gate isolation region 804.2 is arranged in a recess formed in the silicon body 802.

The first drain region 810 and the second drain region 820 are electrically isolated from each other by a second drain isolation region 824. The extent TID2 in a depth direction of the second drain isolation region in the silicon body 702 corresponds to the ones of the second drain region 820, of the first source region 808 and of the first source isolation region 812, i.e. it extends as far as to the upper edge of the second depth section II.

The dimensions of the first and second source regions 808, 818, of the first and second drain regions 810, 820, of the first and second source isolation regions 812, 822, and of the first and second drain isolation regions 814, 824 in a depth direction are chosen such that, during the operation of the two-channel semiconductor component, a first conduction channel 802.1 is formed below the top-gate electrode 804 and a second conduction channel 802.2, that is separated from the first conduction channel 802.1, is formed above the bottom-gate electrode 806 in the silicon body 802, when suitable control voltages UG1 and UG2 are available at the top-gate electrode 804 and the bottom gate electrode 806. The two conduction channels 802.1 and 802.2 are separated from each other by a barrier region 802.3 of the silicon body 802, which is formed when suitable gate voltages are chosen.

This means that, when a suitable first operating voltage UG1 is applied to the top-gate electrode 804, the first conductive channel 802.1 of the n-conductivity type, which is laterally separated from the first source region 808 by the source isolation region 812, is formed in the first depth section I. The extent in a depth direction of said conductive channel 802.1 can be influenced via the control voltage UG1 applied to the top-gate electrode 804. This conductive channel 802.1 does not have any direct contact with the source region 808, since, in a depth direction T, it does not extend as far as to the lower edge of the source isolation region 812. However, when wired in a suitable manner, the first conductive channel 802.1 establishes a conductive connection between the second source region 818 and the first drain region 810. This means that, if necessary, the first conductive channel 802.1 can be operated as the sole conductive channel of the component.

Furthermore, when a suitable second operating voltage UG2 is applied to the bottom-gate electrode 806, a second conductive channel 802.3 of the n-conductivity type is formed in the second depth section II of the silicon body 802. The extent in a depth direction of said second conductive channel 802.3 can be influenced via the control voltage UG2 applied to the bottom-gate electrode 806. To put it more specifically: the voltage applied to the bottom-gate electrode 806 influences how far the second conductive channel 802.2 extends "upwards"—in the direction of the top side of the silicon body—from the bottom side of the silicon body 802. The second operating voltage UG2 is chosen such that the second conductive channel is only formed below the first source region 808, but preferably extends as far as directly to the lower edge of the source region 808. When wired in a suitable manner, the second conductive channel 802.2 establishes a conductive connection between the first source region 808 and the second drain region 820. This means that, if necessary, the second conductive channel 802.2 can be operated as the sole conductive channel of the component.

Thus, the conductive channels 802.1 and 802.2 can be controlled independently of each other. However, it is also possible to operate both conductive channels 802.1 and 802.2 in parallel.

Furthermore, in particular depending on the chosen operating voltages UG1 and UG2, the following operating states can be set:

When respective first and second operating voltages are applied to the top-gate electrode 804 and the bottom-gate electrode 806, a first conductive channel 802.1, which is laterally separated from the source region 808 by the first source isolation region 812 and from the second drain region by the second drain isolation region 824, is formed in the first depth section I, wherein said first conductive channel 802.1 electrically connects the second source region 818 to the first drain region 810. A second conductive channel 802.2, that is decoupled from the first conductive channel by a barrier region 802.3 of the silicon body 802 extending in a depth direction between the conductive channels, is formed in the second depth section. The second conductive channel connects the first source region 818 to the second drain region 820.

If the operating voltages UG1 and UG2 do not satisfy an adjustable resonance condition, this operating state corresponds to the decoupled state shown in FIG. 3. However, charge carrier currents through the aforementioned two conductive channels can be controlled individually.

If the operating voltages UG1 and UG2 satisfy the adjustable resonance condition, the first and second conductive channel 802.1 and 802.2 are coupled to one another by means of a tunnel effect for electrons across the barrier region 802.3 of the silicon body. This means that, in this case, charge carriers can also flow between the first source region 808 and the second drain region 810, and between the second source region 818 and the second drain region 820, namely respectively through the second conductive channel 802.2 by means of a tunnel effect through the barrier region 802.3 and through the first conductive channel 802.1.

FIG. 9 shows a schematic cross-sectional view of the two-channel semiconductor component 700 of FIG. 7 with circuitry for forming a signal mixer 900;

The signal mixer 900 is connected as follows:

The drain current ID at the output of the signal mixer 900, is, on the one hand, controlled at the source electrode by a high-frequency signal on the input side $U_D(t)$, and, on the other, at the bottom-gate electrode, by a local oscillator voltage $\Delta U(t)$. An output voltage $U_{out}(t)$, that corresponds to the product of the high-frequency signal $U_D(t)$ at the source electrode and the local oscillator voltage $\Delta U(t)$ can be picked up at the drain electrode via a resistance R. FIGS. 10 to 12 show corresponding exemplary signals. FIG. 10 shows an exemplary signal of a local oscillator voltage $\Delta U(t)$ as a function of the time in the form of a square wave signal, which can be supplied to the signal mixer of FIG. 9 via its bottom gate electrode. FIG. 11 shows an exemplary signal of a high-frequency signal $U_D(t)$ as a function of the time that can be supplied to the signal mixer of FIG. 9 in parallel via the source electrode. FIG. 12 shows the resulting output signal that corresponds to the product of the two input signals of FIGS. 10 and 11. The signal of the local oscillator switches the signal mixer periodically into a conductive and non-conductive state, so that the output signal corresponds to the product of the local oscillator signal and the input signal.

Such a signal mixer is particularly suitable for use in high-frequency circuits, in particular for use in transmitter and receiver circuits for the transmission of radio signals or optical signals by means of carrier waves.

To sum it up: exemplary embodiments of a two-channel semiconductor component were described. Said component has a doped semiconductor body made of a group IV semiconductor material, a top-side top-gate electrode and a bottom-side bottom-gate electrode. A source region has a greater extent in a depth direction in the silicon body than a drain region. A source isolation region is arranged between a source region and the top-gate electrode, and a drain isolation region is arranged between a drain region and the top-gate electrode, which isolation region extends in a depth direction as far as to the lower edge of a gate isolation layer of the top-gate electrode. In a first operating state a first conductive channel separated laterally from the source region by the source isolation region can be formed, as can a second conductive channel, which is decoupled from the first conductive channel by a barrier region of the semiconductor body extending in a depth direction between the conductive channels. In a second operating state which satisfies a resonance condition, the first and second conductive channel can be coupled to one another by means of a tunnel effect for minority charge carriers over the barrier region of the semiconductor body.

The invention claimed is:

1. A two-channel semiconductor component, comprising:
   a doped semiconductor body formed from a group IV semiconductor material;
   a top-side top-gate electrode;
   a bottom-side bottom-gate electrode,
   a first source electrode with a doped source region of a second conductivity type—that is opposite to a first conductivity type—formed in a silicon body,
   a first drain electrode with a doped first drain region of the second conductivity type formed in the semiconductor body; wherein
   a first source region has a greater extent in a depth direction in the silicon body than the first drain region, and divides the silicon body into a first depth section, that extends as far as to a lower edge of the first source region, and a second depth region that extends in a depth direction adjacently to the first depth section as far as to a bottom side of the semiconductor body;

from a lateral point of view, a first source isolation region is arranged between the first source region and the top-gate electrode, wherein said first source isolation region electrically isolates the first source electrode and the top-gate electrode from each other and extends in a depth direction into the first depth section of the semiconductor body, but not into the second depth section;

from a lateral point of view, a first drain isolation region is arranged between the first drain region and the top-gate electrode, wherein said first drain isolation region electrically isolates the first drain electrode and the top-gate electrode from each other and extends in a depth direction as far as to a lower edge of a gate isolation layer of the top-gate electrode; wherein respective depth direction dimensions of the first source region, of the first drain region, of the first source isolation region and of the first drain isolation region are chosen such that in a first operating state, in which respective first and second operating voltages are applied to the top-gate electrode and the bottom-gate electrode, a first conductive channel of the second conductivity type, which is separated laterally from the first source region by the first source isolation region, can be formed in the first depth section, and a second conductive channel of the second conductivity type, which is decoupled from the first conductive channel by a barrier region of the semiconductor body extending in a depth direction between the conductive channels, can be formed in the second depth section, and in a second operating state, in which third and fourth operating voltages satisfying a resonance condition are applied to the top-gate electrode and the bottom-gate electrode, the first and second conductive channels can be coupled to one another by means of a tunnel effect for minority charge carriers over the barrier region of the semiconductor body.

2. The two-channel semiconductor component according to claim 1, wherein the conductive channels have a channel length of between 5 and 30 nm.

3. The two-channel semiconductor component according to claim 1, wherein the barrier region has an extent in a depth direction of between 10 and 30 nm.

4. The two-channel semiconductor component according to claim 1, comprising a second source region, which is laterally arranged between the first source region and the top-gate electrode, has a smaller extent in a depth direction than the first source region and is laterally electrically isolated from the first source region by the first source isolation region, and which is laterally electrically isolated from the top-gate electrode by a second source isolation region, a second drain region, which, from a lateral point of view, is arranged at a greater distance from the top-gate electrode than the first drain region, has a greater extent in a depth direction than the first drain region and is laterally electrically isolated from the first drain region by a second drain isolation region, and which extends into the second depth section, wherein the respective dimensions of the first and second source regions, of the first and second drain regions, of the first and second source isolation regions, and of the first and second drain isolation regions in a depth direction are chosen such that the first conductive channel extends in the lateral direction between the second source region and the first drain region, and that the second conductive channel extends in the lateral direction between the first source region and the second drain region.

5. The two-channel semiconductor component of claim 1, further comprising a signal mixer having the two channel semiconductor component to which a first input signal is supplied via the bottom-gate electrode, to which a second input signal is supplied via the first source electrode, and at the first drain electrode of which an output signal can be picked up via an output resistance.

6. A detector component for electromagnetic waves, comprising the two-channel semiconductor component according to claim 1.

* * * * *